United States Patent [19]
Dawihl et al.

[11] 3,955,962
[45] May 11, 1976

[54] METHOD OF AND APPARATUS FOR PRODUCING METAL FIBERS IN A MAGNETIC FIELD

[75] Inventors: Walter Dawihl, Illingen, Saar; Walter Eicke, Scheidt, both of Germany

[73] Assignee: Klockner-Werke AG, Duisburg, Germany

[22] Filed: Apr. 14, 1975

[21] Appl. No.: 568,026

[30] Foreign Application Priority Data
Apr. 13, 1974  Germany............................. 2418235

[52] U.S. Cl. .............................. 75/.5 AA; 266/186
[51] Int. Cl.² ........................................... B22F 9/00
[58] Field of Search............. 75/.5 R, .5 AA, .5 BA; 266/1 R, 24

[56] References Cited
UNITED STATES PATENTS

| | | | |
|---|---|---|---|
| 2,604,442 | 7/1952 | Lambert et al. .................. | 75/.5 AA |
| 2,674,528 | 4/1954 | Beller et al. ....................... | 75/.5 AA |
| 3,570,829 | 3/1971 | Schladitz............................ | 266/1 R |

*Primary Examiner*—W. Stallard
*Attorney, Agent, or Firm*—Michael J. Striker

[57] ABSTRACT

A magnetic field is generated whose flux lines extend normal to a planar supporting surface which is located in an enclosed annular space. Carbonyls of metallic material are fed into the enclosed space so that they travel lengthwise of the flux lines and normal to the plane of the supporting surface. The space is then heated to a decomposition temperature at which the carbonyls undergo thermal decomposition and liberate metal atoms which agglomerate under the influence of the flux lines on the supporting surface and form on the latter metal fibers which project from the supporting surface in a direction normal thereto, i.e., opposite to the direction of travel of the carbonyls themselves.

26 Claims, 8 Drawing Figures

PRIOR ART

METHOD OF AND APPARATUS FOR PRODUCING METAL FIBERS IN A MAGNETIC FIELD

BACKGROUND OF THE INVENTION

The present invention relates to the production of metal fibers, and in particular to a method of producing metal fibers in a magnetic field and to an apparatus for carrying out the method.

The production of metal fibers or whiskers in a magnetic field by thermal decomposition of metallic carbonyls is known from German Pat. No. 1,224,934. The disclosure of that patent is herewith incorporated herein in its entirety.

According to the teaching of German Pat. No. 1,224,934, carbonyls of metals capable of thermal decomposition are fed into a space in direction counter to a temperature gradient that has been produced in this space. In the heated space the metal carbonyls undergo thermal decomposition and liberate metal atoms which are oriented and stabilized in a homogeneous magnetic field. The patent discloses that it is possible in this manner to produce poly-crystalline metal whiskers or fibers of a length which can be determined and selected at will, and which are characterized by exceptional structural strength. The carbonyls of ferromagnetic materials are fed into an oxygen-free space, which may, for example, be filled with inert gas, in minute quantities on the order of $10^{-4}$ to $10^{-10}$ mol per $cm^3$, counter to a temperature gradient that is produced in this space. The carbonyls undergo thermal decomposition and liberate metal atoms which agglomerate to minute crystals which are oriented by a homogeneous magnetic field with reference to one another and to the flux lines of the magnetic field to produce parallel aggragation chains which are mechanically stabilized by the magnetic field. Thereupon, additional carbonyls of ferromagnetic and/or paramagnetic metals are fed into the space and made to travel in the same counter to the temperature gradient, while at the same time the temperature of the aggregation chains is accommodated to the temperature necessary for a coherent liberation of these latter metals, and the fibers or whiskers continue to grow until they have the desired thickness.

It is possible in this manner to produce metal fibers having a very large ratio of diameter to length, for example 1:100,000 or more, and wherein the diameter of the fiber with reference to the diameter of the coagulation chain has a ratio of 1,000,000:1 or higher. Due to this structural characteristic of the individual metal fibers so produced, metallic materials which are subsequently manufactured from these fibers—e.g., by sintering—can have a strength which heretofore was not attainable.

The apparatus used in this patent for carrying out the method comprises an elongated annular reaction chamber formed between an inner perforated pipe which is heated to the vaporization temperature of the carbonyl and an outer metal pipe which is heated from the exterior by means of heating rods or the like. The inner perforated pipe serves as a vaporizer, and located within it is a further pipe which is heated by means of a circulating heating fluid. On this latter pipe there is located a helical structure on which liquid iron carbonyl seeps downwardly in a spiral path, to undergo vaporization and to enter through the perforated inner tube into the reaction chamber. The upper end of the reaction chamber is closed by a piston which on completion of the operation serves to expel the finished metal fibers from the interior of the chamber into a collecting receptacle that is located beneath the apparatus. Because carbonyls are poisonous, the device is constructed to be gas tight. The annular chamber, that is the interior thereof, is subjected to the influence of a magnetic field which extends parallel to the heating surface, and for which purpose magnetic poles or a magnetic winding are provided. The carbonyl vapor enters the chamber, as already indicated, in direction counter to a temperature gradient produced in the chamber, and the maximum temperature of the heater surface in the region of the outer wall is substantially higher than the temperature at which the metal carbonyls undergo complete thermal decomposition.

SUMMARY OF THE INVENTION

It is an object of this invention to provide an improvement over the teachings of the aforementioned German patent.

More particularly, it is an object of the present invention to provide an improved method of producing metal fibers or whiskers in a magnetic field by thermal decomposition of metal carbonyls.

A further object of the invention is to provide an apparatus for carrying out the novel method.

In the German patent, the metal fibers which develop in the reaction chamber begin to grow on the inner surface of the outer wall bounding the chamber and grow either in direction parallel or at an acute angle to the inner surface of the outer wall. Many of the fibers tend to cohere, forming clumps, so that individual fibers are no longer present.

It is very often desired, however, that the fibers remain individual, and the present invention aims to provide a method and an apparatus which makes it possible to produce and maintain the fibers separate and to prevent their clumping together.

Another object of the invention is to avoid crumpling or breaking of the fibers.

A further object of the invention is to avoid the possibility that fibers might clump together while being expelled, and to prevent an expelling device from becoming jammed.

In keeping with these objects, and with others which will become apparent hereafter, one feature of the invention resides in a method of producing metal fibers in a magnetic field which, briefly stated, comprises the steps of generating magnetic flux lines which extend normal to a planar supporting surface located in an enclosed space, feeding carbonyls of metallic materials into said enclosed space for travel lengthwise of said flux lines and normal to said supporting surface, and heating said space to a decomposition temperature at which the carbonyls undergo thermal decomposition and liberate metal atoms which agglomerate under the influence of said flux lines on said supporting surface and form thereon metal fibers which project from the supporting surface in direction normal thereto.

The supporting surface, or rather the element on which it is provided or of which it forms a part, can be shifted axially of the enclosed space, which is of annular configuration, and the shifting can be regulated in accordance with the speed at which the metal fibers grow on the supporting surface. The fibers begin to grow at the plane of the supporting surface, and grow outwardly away from the supporting surface in direction oppositely to the travel of the incoming carbonyl vapors. Heating gas is supplied into the annular reactor chamber from the center of the same, and a temperature gradient is established from the center towards the outer wall bounding the chamber. The inner wall bounding the chamber is heated to a temperature substantially higher than the decomposition temperature of the carbonyls, e.g., to approximately 500°C if iron carbonyls are to be decomposed. The temperature of the outer wall bounding the reaction chamber, on the other hand, is substantially below the decomposition temperature of the carbonyls, e.g., approximately 120°C when iron carbonyl is to be decomposed.

The carbonyls themselves are vaporized outside the reaction chamber and the vapor is then admitted into the reaction chamber from the exterior. It is possible to provide two or more separate vaporizing devices located exteriorly of the reaction chamber, and this is particularly advantageous if two or more different types of carbonyls are to be vaporized, for example to be vaporized simultaneously. The vapors of these different carbonyls can then be introduced together or simultaneously into the reaction chamber and this makes it possible to produce metal fibers which are composed of metal alloys. A further possibility is to first produce metal fibers in the reaction chamber and to thereupon introduce carbonyls of a metal or metals different from the one of the metal fibers, e.g., of nickel, molybdenum or chromium, which liberate metal atoms that then form a coating or plating on the already produced metal fibers. To obtain advantageous flow conditions and agitation of the vapor or vapors in the chamber, the gaseous vaporized carbonyl is preferably introduced into the annular reaction chamber in tangential direction.

The apparatus of the present invention comprises a reaction chamber, magnetic means for producing in said reaction chamber magnetic flux lines extending in a predetermined direction, feeding means for feeding into said reaction chamber vaporized metal carbonyls for travel in the chamber along the flux lines in the aforementioned direction, and heating means for heating the interior of the chamber to a temperature at which the carbonyls undergo thermal decomposition and liberate metal atoms. According to the invention, intercepting means is provided in the chamber for intercepting the metal atoms; this intercepting means has a supporting surface extending normal to the direction of travel of the incoming carbonyl vapors, and on which the metal atoms agglomerate under the influence of the flux lines and form metal fibers which project from the supporting surface normal thereto and in direction opposite to the direction of flow of the incoming metal carbonyl vapor.

The intercepting means may be provided at or in the region of its surface of a nonferromagnetic material, for example a nonferromagnetic wire net. The planar supporting surface constitutes the stabilizing or crystallizing plane, at which the metal atoms crystallize and become stabilized to begin forming the metal fibers which it is desired to produce.

As mentioned before, the metal carbonyls are vaporized exteriorly of the reaction chamber in vaporizing devices. A single such device may be provided, or if it is desired to be able to vaporize a plurality of metal carbonyls, for example different metal carbonyls in each device and at the same time, a plurality of such devices may be provided; the devices may be arranged annularly about the reaction chamber and/or may be offset axially of the reaction chamber relative to one another.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

DESCRIPTION OF THE PREFERRED EMBODIMENTS

Figure 1:
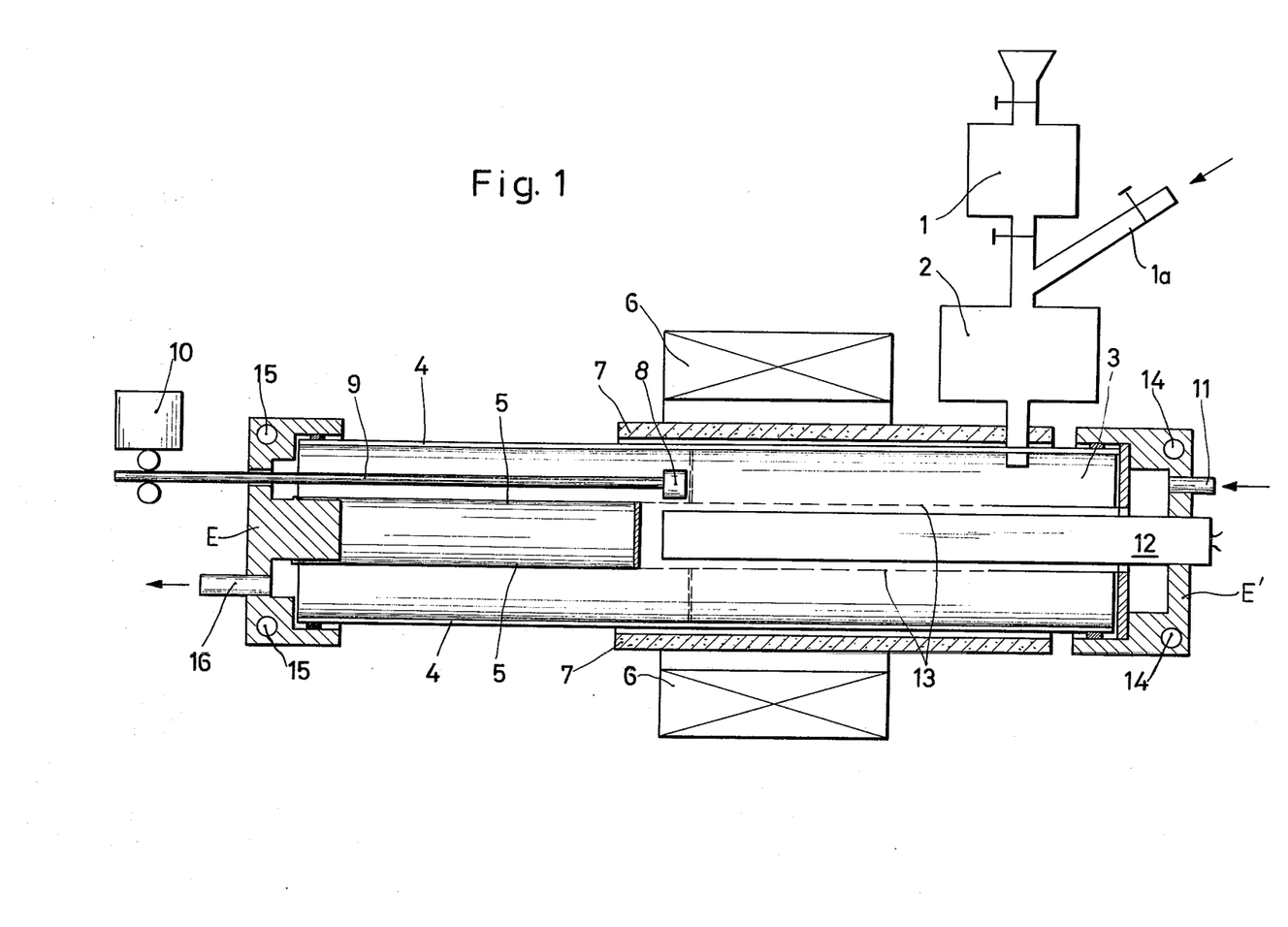
FIG. 1 is a somewhat diagrammatic partial axial section through an apparatus according to the present invention.
Figure 2:
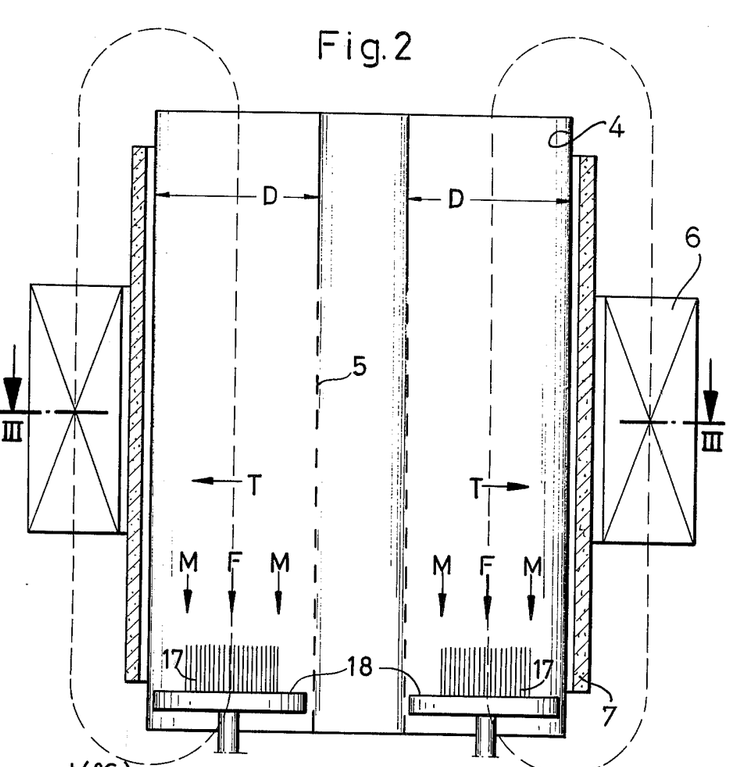
FIG. 2 is an enlarged-scale axial section taken on line II—II of FIG. 3.
Figure 3:
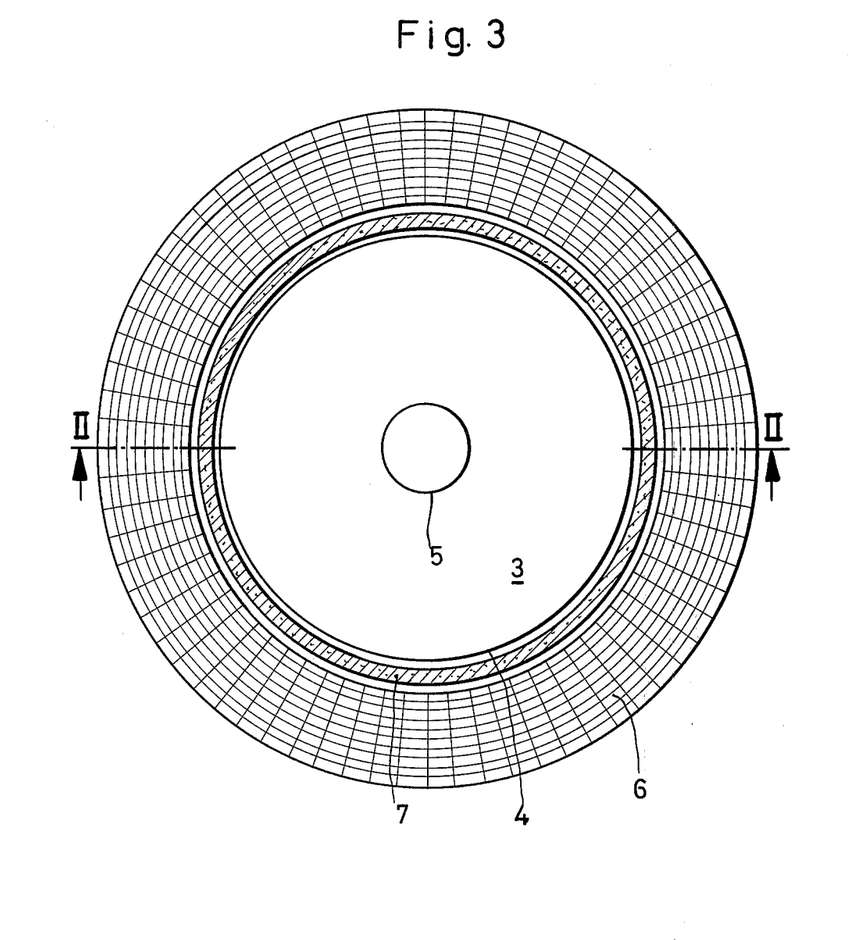
FIG. 3 is a section taken on line III—III of FIG. 2.

Referring now to the drawing in detail, and firstly to FIGS. 1, 2 and 3, it will be seen that reference 1 identifies a container for liquid carbonyl, for example liquid iron carbonyl. The carbonyl enters from the container 1 into a vaporizer 2 which may operate on the same principle as the one disclosed in the aforementioned German patent and wherein the liquid carbonyl becomes vaporized, i.e., converted into its gaseous phase. After leaving the receptacle 1, and prior to entry into the vaporizer 2, the liquid carbonyl comes into contact with a carrier gas which is admitted through the inlet conduit 1a. As mentioned before, components such as the receptacle 1 and the vaporizer 2 may be provided annularly spaced and/or axially offset relative to the reaction chamber 3, for example if several types of carbonyls are to be supplied to the reaction chamber 3, e.g., in order to produce alloyed metal fibers.

The reaction chamber 3 is annular and formed between an outer tube 4 and an inner tube 5; the opposite axial ends of the chamber 3 are closed by end members E and E', respectively. Because of the poisonous character of the carbonyls, the device is preferably gas tight. A tubular heating jacket 7 surrounds the chamber, i.e., the outer tube 4 may have a plurality of electric heating rods embedded in it, for example. The jacket 7 in turn is surrounded by an electromagnetic winding 6 which, when energized, produces a magnetic field whose flux lines F are shown by the arrow in FIG. 2. The flux lines extend axially and in parallel to the walls bounding the chamber 3.

A transporting device for the produced metal fibers is provided in form of a piston 8 which in the illustrated embodiment is mounted on a piston rod 9 that extends through a sealed opening in one of the end members, in the illustrated embodiment the end member E, and is engaged by a diagrammatically illustrated device 10 which permits to piston rod 9 and the piston 8 to be displaced axially of the reaction chamber 3. The device 10 is an infinitively variable electromotor, which moves the piston rod 9, being constructed as a rack, axially by means of a pinion. The velocity of the movement corresponds to the growing velocity of the fibers. FIG. 1 shows the starting position, which shall not lie more on the right side. The free end face of the piston 8, with a wire mesh carried by it as in the illustrated embodiment in FIG. 1, constitutes the support surface on which the metal fibers will grow. The wire mesh in this embodiment is annular and surrounds the inner tube 5 within the chamber 3. The free end face with the wire mesh, which constitutes the stabilizing and crystallizing plane for the fibers 17, is identified with reference numeral 18 in FIG. 2.

Reference numeral 11 identifies an inlet for a heating gas which first travels along the heating device 12 that is located within the inner tube and which is advantageously heated as indicated by the portions of electrical lead wires shown at the right-hand end of the device 12 in FIG. 1. By contact with the device 12, the gas entering through the inlet 11 becomes heated and then enters through the apertures 13 which are provided in a portion of the inner tube 5, into the reaction chamber 3. Reference numeral 14 identifies inlets and reference numeral 15 identifies outlets for a cooling fluid; the inlets and outlets are connected with one another in a manner not illustrated so that the cooling fluid can circulate between them. Reference numeral 16 identifies an outlet for excess gases and also for carbon monoxide which is liberated during the thermal decomposition of the carbonyls.

FIG. 2 shows clearly that the fibers grow on the surface 18 in a direction normal to the plane of this surface, i.e., in direction counter to the flow of the incoming carbonyl vapor, which flow is identified by the arrows M and will be seen to extend parallel to the magnetic flux lines F, so that both the magnetic flux lines and the flow of incoming vaporized carbonyl extend normal to the plane of the surface or surfaces 18. The growth of the fibers 17 begins at the surface 18 and the fibers then become progressively elongated in direction opposite to the arrows M and F, i.e., upwardly in FIG. 2. The temperature gradient in the chamber 3 is identified by the arrows T and extends transverse to the longitudinal extent of the chamber 3. It should be understood that while the gradient here is from the inner tube 5 towards the outer tube 4, it could also be reversed to be from the outer tube 4 towards the inner tube 5, or could extend in still another direction. Because of the indicated growth of the fibers 17, the latter cannot clump together and, when they are finally ejected by means of the piston 8, e.g., in response to removal of one of the end members, they will not become mangled, damaged or clumped together, nor can they interfere with the free movement of the piston 18 in the chamber 3. The piston 8 can be moved in the chamber 3 during the growth of the fibers 17, and the speed of movement can be regulated in dependence upon the speed of growth of the fibers 17.

Figure 2A:
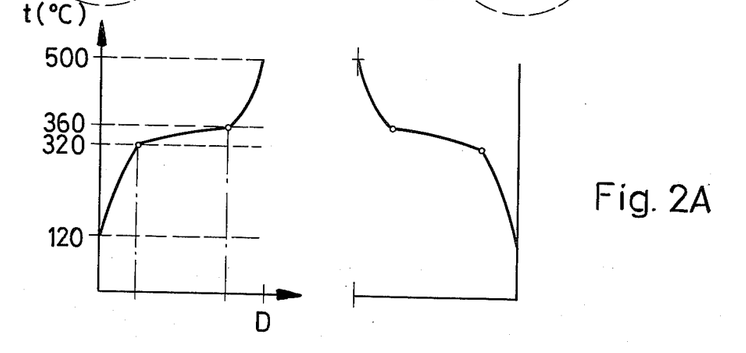
FIG. 2a is a temperature diagram representing the conditions which obtain which iron carbonyl is to be decomposed.

FIG. 2a shows by way of example a diagram which is illustrative of the temperature conditions which obtain when iron carbonyl is to be thermally decomposed. It will be seen that the inner wall of the chamber 3, i.e., the tube 5, is heated for this purpose to a temperature on the order of 500°C and the outer wall represented by the outer tube 4 is heated to a temperature of approximately 120°C. The thermal decomposition of iron carbonyl takes place approximately in the temperature range betwen 320° and 360°C, so that within this temperature range the growth of fibers 17 takes place on the surface 18. The temperature gradient T develops automatically as a result of the flow and temperature conditions which prevail in the chamber 3.

Figure 4:
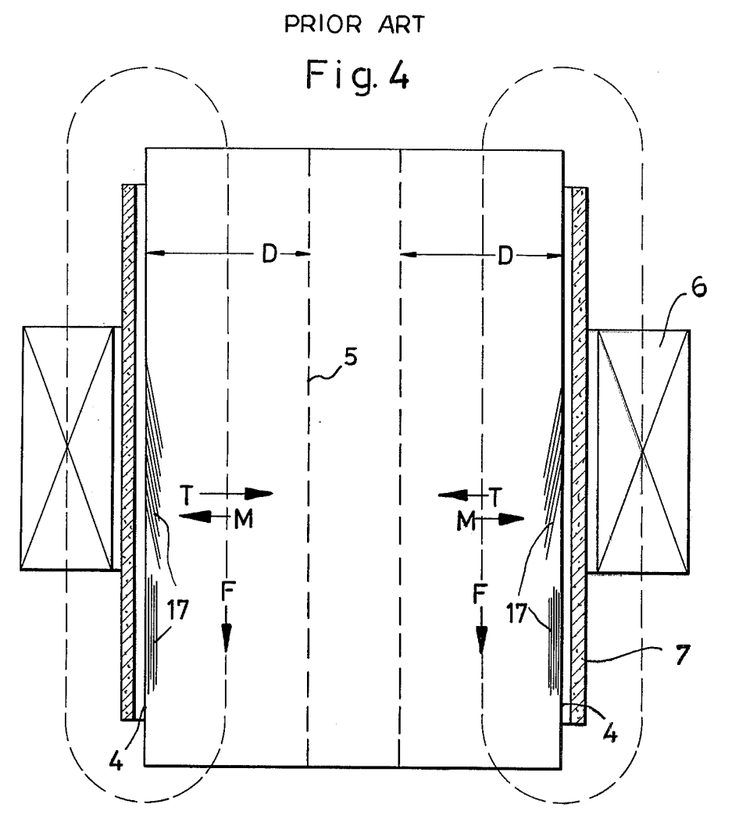
FIG. 4 is a view similar to FIG. 2, but illustrating by way of comparison a prior-art apparatus.

To facilitate a comparison of the present invention with the prior art, FIG. 4 has been provided which shows the prior-art apparatus in an illustration analogous to that of the present apparatus provided in FIG. 2. To further ease comparison, like reference numerals have been employed in FIG. 2 and in FIG. 4.

It will be seen in FIG. 4 that the temperature gradient T is the reverse of that shown in FIG. 2, i.e., it is from the outer wall 4 towards the inner wall 5 so that it is the outer wall 4 that is heated to approximately the upper limit of the range of decomposition temperature (e.g., of iron carbonyl) whereas the inner wall 5 is heated only to a temperature of approximately 120°C. The magnetic flux lines F have the same orientation as in FIG. 2, but the flow direction M of the vaporized metallic carbonyl is directed radially outwardly in the chamber 3, so that it extends transverse of the flux lines F and is counter to the temperature gradient in the chamber 3, as is indeed a requirement of the prior art. This means that the flow direction M includes an angle of approximately 90° with the direction F of the magnetic flux lines, and as a result the fibers 17 grow either parallel to or at an acute angle to the longitudinal axis of the reaction chamber 3, on the inner surface of the outer wall 4 thereof.

Figure 4A:
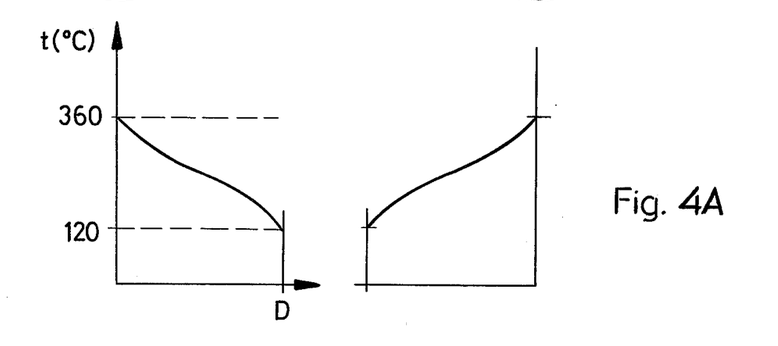
FIG. 4a is temperature diagram similar to FIG. 2a, but illustrating the conditions which obtain in the apparatus of FIG. 4 when iron carbonyl is to be decomposed.

FIG. 4a is a temperature diagram representing the temperature conditions which obtain in the prior-art apparatus of FIG. 4 when iron carbonyl is to be decomposed to obtain metal atoms for the growth of the fibers 17.

Figure 5:
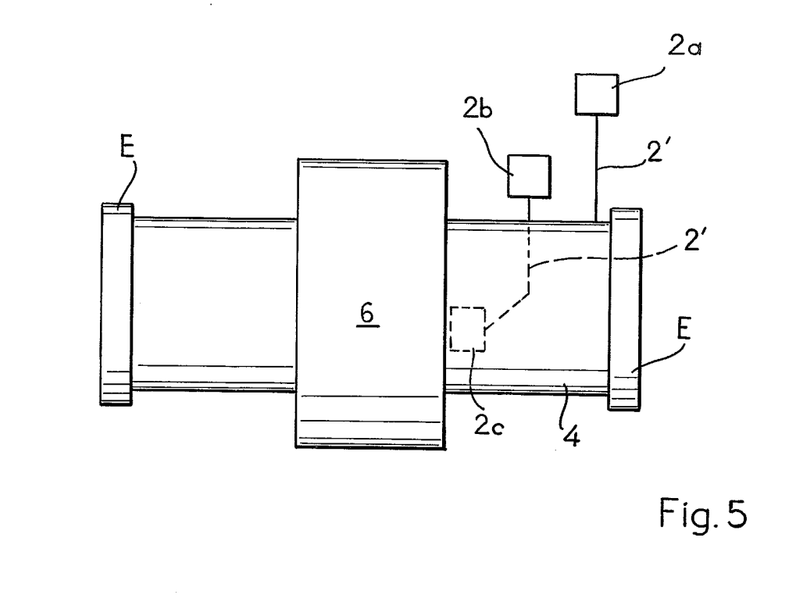
FIG. 5 is a very diagrammatic side view showing a further embodiment of the invention.

FIG. 5 shows diagrammatically an apparatus according to the present invention, wherein again the same reference numerals identify the same elements as with respect to FIGS. 1, 2 and 3. The only difference of the apparatus in FIG. 5 from that of FIGS. 1, 2 and 3 is that a plurality of vaporizing devices 2a, 2b and 2c will be seen to be axially and circumferentially offset with reference to the outer wall 4, being connected with the chamber 3 (which is not shown in FIG. 5) by means of the diagrammatically indicated conduits 2'.

Figure 6:
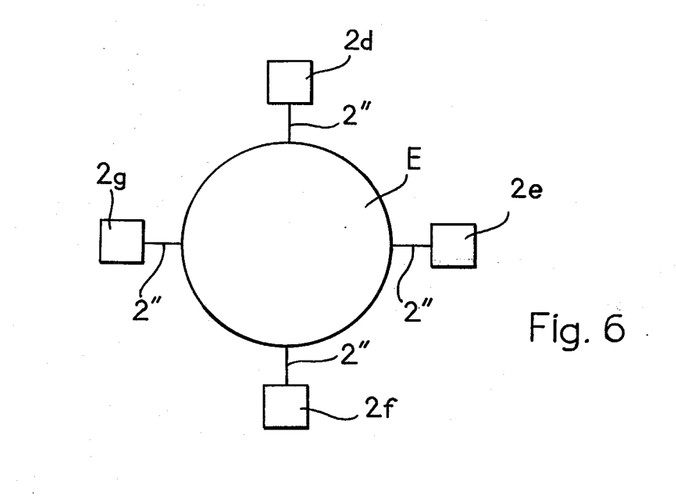
FIG. 6 is a diagrammatic end view of an apparatus showing still another embodiment of the invention.

FIG. 6, finally, is an end view of an apparatus such as the one shown in FIGS. 1, 2 and 3, and serves to diagrammatically illustrate that a plurality of the vaporizing devices 2d, 2e, 2f and 2g (or more or fewer than those illustrated) may be arranged annularly about the apparatus, and connected with the chamber 3 (which is not shown in FIG. 6) by means of the conduits 2''. The embodiments of FIGS. 5 and 6 may be utilized when it is, for example, desired to supply from each of the different vaporizing devices the vapor of a different metal carbonyl into the chamber 3, so that these different vapors are all decomposed together in the chamber 3 and will form fibers 17 that are metal alloys, rather than of a single metal.

It will be understood that each of the elements described above, or two or more together, may also find a useful application in other types of constructions differing from the type described above.

While the invention has been illustrated and described as embodied in the production of metal fibers in a magnetic field, it is not intended to be limited to the details shown since various modifications and structural changes may be made without departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention.

What is claimed as new and desired to be protected by Letters Patent is set forth in the appended claims.

1. A method of producing metal fibers in a magnetic field, comprising the steps of generating magnetic flux lines which extend normal to a planar supporting surface located in an enclosed space; feeding carbonyls of metallic materials into said enclosed space for travel lengthwise of said flux lines and normal to said supporting surface; and heating said space to a decomposition temperature at which the carbonyls undergo thermal decomposition and liberate metal atoms which agglomerate under the influence of said flux lines on said supporting surface and form thereon metal fibers which project from the supporting surface in direction normal thereto.

2. A method as defined in claim 1, said space being annular, and wherein said flux lines extend parallel to a longitudinal axis of the space.

3. A method as defined in claim 2, said space being bounded by inner and outer circumferential walls; and wherein the step of heating comprises supplying a heating medium to said space through the inner wall thereof.

4. A method as defined in claim 2, wherein the step of heating comprises establishing in said space a temperature gradient transversely of said longitudinal axis.

5. A method as defined in claim 4, wherein said space is bounded by inner and outer circumferential walls; and wherein the step of heating comprises establishing the said space a temperature gradient transversely of said longitudinal axis and from said inner to said outer wall.

6. A method as defined in claim 5, wherein the step of establishing said temperature gradient comprises heating said inner wall to a temperature substantially higher than said decomposition temperature.

7. A method as defined in claim 5, the carbonyls being iron carbonyls; and wherein the step of establishing said temperature gradient comprises heating said inner wall to a temperature on the order of 500°C.

8. A method as defined in claim 1, said space being annular and bounded by inner and outer circumferential walls to which said flux lines extend in axial parallelism; and wherein the step of heating comprises heating said outer wall to a temperature substantially lower than said decomposition temperature.

9. A method as defined in claim 8, wherein the corbonyls are iron carbonyls; and wherein the step of heating comprises heating said outer wall to a temperature on the order of 120°C.

10. A method as defined in claim 1; and further comprising the step of moving said supporting surface in said space in longitudinal direction of said flux lines.

11. A method as defined in claim 1; and further comprising the step of moving said supporting surface in said space in longitudinal direction of said flux lines and in dependence upon the rate of longitudinal growth of said metal fibers.

12. A method as defined in claim 1; further comprising the step of vaporizing the carbonyls outside said space preliminary to feeding of the resulting vapors into said space.

13. A method as defined in claim 12, wherein said space is annular, and wherein the step of feeding comprises admitting the vapors into said annular space from the radially outer side thereof.

14. A method as defined in claim 12, wherein said space is annular, and wherein the step of feeding comprises admitting said vapors tangentially into said annular chamber.

15. A method as defined in claim 12, wherein the step of vaporizing comprises carrying out the vaporization in a plurality of separate vaporizing devices.

16. A method as defined in claim 15, wherein the step of vaporizing comprises vaporizing in each of said devices a carbonyl of a different metallic material.

17. A method as defined in claim 16, wherein the step of feeding comprises admitting the vapors from at least two of said devices simultaneously into said space, so as to obtain alloyed metal fibers.

18. A method as defined in claim 1; and further comprising the steps of admitting, upon formation of said fibers on said supporting surface, additional carbonyls of metallic material different from said fibers, and effecting the thermal decomposition of said additional carbonyls, so as to coat the originally formed fibers with the metal liberated by thermal decomposition of said additional carbonyls.

19. Apparatus for producing metal fibers in a magnetic field, comprising a reaction chamber; magnetic means for producing in said reaction chamber magnetic flux lines extending in a predetermined direction; feeding means for feeding into said reaction chamber vaporized metal carbonyls for travel in said chamber along said flux lines in said direction; heating means for heating the interior of said chamber to a temperature at which said carbonyls undergo thermal decomposition and liberate metal atoms; and intercepting means in said chamber for said metal atoms and having a supporting surface extending normal to said direction and on which said metal atoms agglomerate under the influence of said flux lines and form metal fibers which project from said supporting surface normal thereto and opposite to said predetermined direction.

20. Apparatus as defined in claim 19, wherein said intercepting means is composed, at least at said supporting surface thereof, of a magnetically inactive material.

21. Apparatus as defined in claim 19, wherein said intercepting means is a wire mesh of magnetically inactive material.

22. Apparatus as defined in claim 19, wherein said reaction chamber is annular and bounded by tubular inner and outer circumferential walls; said inner wall being in part perforate, and said heating means comprising a heater device located within the confines of said inner tubular wall and from which heated gas issues into said confines to heat said inner wall and thereupon enters into said chamber through the perforations.

23. Apparatus as defined in claim 19; further comprising at least one vaporizer for vaporizing the carbonyl, said one vaporizer being outside said chamber and connected with said feeding means.

24. Apparatus as defined in claim 19; further comprising a plurality of vaporizers for vaporizing the carbonyl, said vaporizers being arranged in an annulus about said reaction chamber and connected with said feeding means.

25. Apparatus as defined in claim 19; further comprising a plurality of vaporizers, each for vaporizing the carbonyl of a different metallic material, said vaporizers being arranged about said reaction chamber and connected with said feeding means.

26. Apparatus as defined in claim 19, said reaction chamber being annular; and further comprising a plurality of vaporizers for metallic carbonyls arranged about said reaction chamber offset relative to one another in axial direction of the chamber and being connected with said feeding means.

* * * * *